United States Patent [19]

Elder

[11] 4,241,309

[45] Dec. 23, 1980

[54] SYNCHRONIZING METHOD AND APPARATUS

[75] Inventor: William L. Elder, Richmond, Calif.

[73] Assignee: Andros Incorporated, Berkeley, Calif.

[21] Appl. No.: 948,875

[22] Filed: Oct. 5, 1978

[51] Int. Cl.³ .......................................... H03K 5/153
[52] U.S. Cl. .................................. 328/115; 307/269;
307/358; 328/139; 328/151
[58] Field of Search ................... 307/269, 358, 356;
328/117, 127, 147, 151, 115, 116, 139

[56] References Cited

U.S. PATENT DOCUMENTS

| 3,348,065 | 10/1967 | Schmidt | 307/358 X |
| 3,804,979 | 4/1974 | Knowles | 307/358 X |
| 4,156,202 | 5/1979 | Takahashi | 307/358 X |

Primary Examiner—John Zazworksy

Attorney, Agent, or Firm—Fitch, Even, Tabin, Flannery & Welsh

[57] ABSTRACT

A method and apparatus are described for developing a series of synchronizing pulses related to a series of input pulses of variable amplitude above a background noise level. A first signal is developed proportional to the derivative of the rising or falling portion (or both) of each of the input pulses. A second signal is developed related to the first signal and having a decay characteristic such that the amplitude of the second signal becomes equal to the amplitude of the first signal at a threshold point which is proportional to the amplitude of the first signal. The synchronizing pulses are developed related to respective threshold points whereby the phase of the synchronizing signal is not dependent on the amplitude of the input pulses.

8 Claims, 4 Drawing Figures

SYNCHRONIZING METHOD AND APPARATUS

This invention relates generally to a method and apparatus for developing synchronizing pulses such as may be used in analog or digital electronic signal processing systems. More particularly, the invention relates to a method and apparatus for developing a series of synchronizing pulses related to a series of input pulses of variable amplitude above a background noise level.

In certain electronic signal processing systems, it may be desirable to develop a series of synchronizing pulses related to a series of input pulses of variable amplitude above a given level of background noise. One particular example of this is in connection with the processing of signals developed by non-dispersive infrared gas analyzers. Gas analyzers of this general type are well known in the art and are shown and described, for example, in U.S. Pat. No. 4,013,260, McClatchie et al, issued Mar. 22, 1977, assigned to the assignee of the present invention; and U.S. Pat. No. 3,899,252, Dimeff, issued Aug. 12, 1975, and assigned to the United States of America. In both of these patents, and in similar types of infrared gas analyzers, a beam of infrared energy is passed through a sample cell containing an unknown gas mixture. The beam is varied by the interposition of a successive number of filters of different wavelengths in the path of the light beam. Because of certain filter and detector characteristics, not all wavelengths result in the same detector output. Thus a signal is produced by the infrared detector comprising a series of pulses having variable amplitude.

In processing the signals typically developed in the foregoing described type of gas analyzer, it is necessary to perform gating or switching in order to process and demodulate the resulting pulsed signal. This gating or switching typically requires accurate phase coherence of the gating or synchronizing signal with the pulses of the input or detected signal. In order to accomplish this, many prior art systems and techniques employ electromechanical or electro-optical means to produce phase related timing signals. This typically necessitates the employment of a separate detection system with accompanying electronics, increasing the cost and complexity of the system.

It is an object of the present invention to provide an improved method for developing a series of synchronizing pulses related to a series of input pulses of variable amplitude above a background noise level.

Another object of the invention is to provide an improved method and improved apparatus for developing synchronizing pulses in an infrared gas analyzer or the like.

A further object of the invention is to provide a method for developing a series of synchronizing pulses related to a series of input pulses provided by a rotary filter wheel without the necessity of employing separate electromechanical or electro-optical detectors for the filter wheel.

Other objects of the invention will become apparent to those skilled in the art from the following description, taken in connection with the accompanying drawings wherein.

Very generally, the apparatus of the invention includes means 11 for developing a first signal proportional to the derivative of the rising or falling portion (or both) of each of the input pulses. Means 13 are provided for developing a second signal related to said first signal and having a decay characteristic such that the amplitude of the second signal becomes equal to the amplitude of the first signal at a threshold point which is proportional to the first signal. Means 15 develop the series of synchronizing pulses each related to a respective threshold point. Accordingly, the phase of the synchronizing pulses is not dependent on the amplitude of the input pulses.

Figure 1:
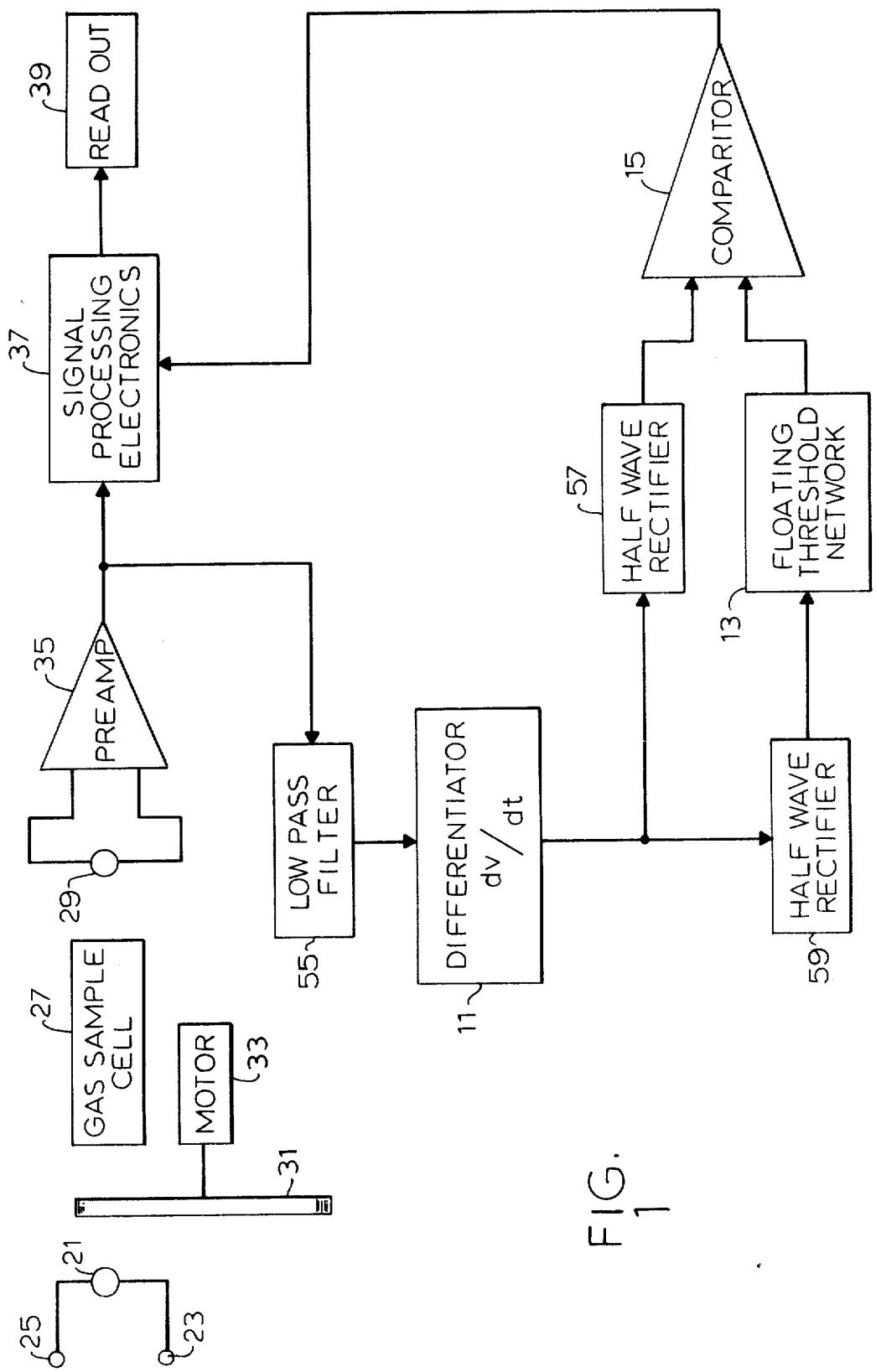
FIG. 1 is a schematic block diagram of apparatus constructed in accordance with the invention and employed in connection with an infrared gas analyzer.

Referring more particularly to FIG. 1, the apparatus is shown in connection with a simplified block diagram of an infrared gas analyzer. The gas analyzer includes an infrared source 21 of suitable design connected across a pair of terminals 23 and 25. Infrared energy from the source 21 is transmitted through a gas sample cell 27 to a detector 29. To periodically interpose one or more filters in the path of the radiation from the infrared source 21, a rotary filter wheel 31 is interposed partially in the path of the infrared beam between the source 21 and detector 29. The wheel 31 is rotated by a suitable motor 33 to periodically interpose one or more filters in the path of the infrared energy passing through the gas sample cell 27. As is known in the art, these filters correspond to the wavelength of the absorption characteristic of the gas or gases being analyzed for, passing energy only at that wavelength. A reference filter may also be used unrelated to any of the gases present.

Signals from the detector 29 are passed by a preamplifier 35 to the input of the signal processing electronics 37. The design of the signal processing electronics 37 may be of any type for developing the information desired from the infrared gas detector. The signal processing electronics 37 may be digital or analog in design and the information developed thereby is passed to a suitable readout system, display, or processor 39.

Depending upon a particular design of the signal processing electronics 37, the timing requirements will vary. Thus, if more than one gas is being analyzed for, several different series of timing signals may be required. Examples of such circuitry may be found in the aforementioned U.S. patents and in other patents relating to gas analyzers. Accordingly, the details of such circuits will not be described herein.

In any case, the signal processing electronics 37 does require some sort of phase information related to the phase of the pulses produced by rotation of the chopper wheel 31. Such phase information can be derived from the chopper wheel by suitable electromechanical or electro-optical systems. However, such systems are typically expensive and add complexity to the apparatus which may be undesirable. Moreover, such systems frequently require stabilization of temperature and isolation against vibration, which add further complications.

Figure 2:
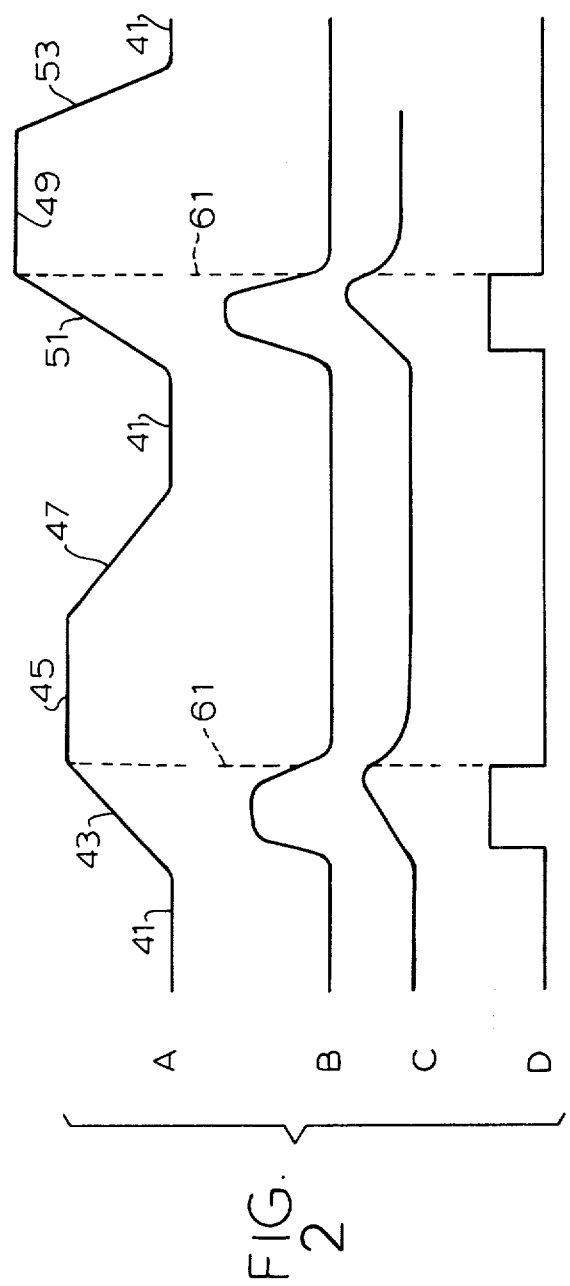
FIG. 2 is a graph illustrating the relationship of several of the wave forms produced in the system of FIG. 1.

The present invention utilizes the input signal to the signal processing electronics 37 directly to derive phase information for the signal processing electronics. Thus, electromechanical or electro-optical devices related to the filter wheel 31 are not required. Referring to FIG. 2, a typical wave form A of the input signal to the signal processing electronics 37 may be seen. The background radiation level is indicated at 41. The region of the curve 43 represents the unbreaking or unchopping of the infrared beam as an optical filter moves into the path of the beam. The level 45 represents the region where the optical filter is fully interposed between the source 21 and the detector 29. The region 47 of the curve represents the decay time as the gap or optical filter moves out of the optical path. The second pulse shown on wave form A represents the interposition of a second filter at a later time and having a different maximum amplitude level, shown at 49. The rising edge 51 and the falling edge 53 are also different in their slope. These conditions may result from the fact that a different transmissivity exists in the filter which is interposed in the optical path. Another cause of such variation may be the physical configuration of the filter itself, or a change in the constitution of the gas mixture in the gas sample cell 27. In any case, the actual wave form shape is a function of the particular optical system used. However, the basis of the operation of the invention can be applied to most wave shapes generated in the manner previously described. A similar wave form may be generated by a chopper wheel used to produce an a.c. signal from the d.c. signal. The invention is applicable to this latter case as well.

For accurately relating the synchronizing pulses to the input pulses for the signal processing electronics 37, the synchronizing pulses must be initiated (or terminated) at fixed points relative to the input wave form. The present invention accomplishes this in the presence of noise in the input signal, chopping rate fluctuations, and pulse amplitude variations.

Returning now to FIG. 1, the apparatus of the invention, as illustrated therein, includes a low pass filter 55 connected to the output of the preamplifier 35. The low pass filter serves to remove high frequency noise. The filtered output of the low pass filter is applied to a differentiator 11 which develops a first signal proportional to the derivative of the rising and falling portion of each of the input pulses. Although both the rising and falling portions of the pulses may be used, only one portion is used in the embodiment described herein. The other portion thereof is removed by a half wave rectifier 57 connected to the output of the differentiator 11. The resulting wave form, where the leading edge of the input pulses is used, is illustrated in wave form B of FIG. 2.

An identical signal to wave form B, developed by a suitable half-wave rectifier 59, is applied to the floating threshold network 13. The floating threshold network 13 may be a scaled peak detector with controlled delay such that a second signal is developed having a decay characteristic such that the amplitude of the second signal becomes equal to the amplitude of the first signal at a threshold point which is proportional to the amplitude of the first signal. The signal developed by the floating threshold network 13 is illustrated as wave form C in FIG. 2. The dotted line 61 in FIG. 2 indicates the threshold point at which the wave form C crosses the wave form B.

The output of the half-wave rectifier 57 is applied to one input of the comparator 15. Similarly, the output of the floating threshold network 13 is applied to the other input of the comparator 15. The comparator 15 serves to develop the series of synchronizing pulses which are each related to a respective threshold point. The comparator merely serves to switch on when the voltage at the upper input exceeds the voltage at the lower input, and to switch off when the reverse is true. The result is the wave form D shown in FIG. 2 wherein the trailing edge of the wave form constitutes the synchronizing point. On the other hand, the system could be designed to utilize the leading edge of the pulses as well. It is desirable that some hysteresis be employed in the comparator 15 for additional noise immunity.

The result is that the phase of the pulses shown in the wave form D of FIG. 2 is not dependent upon the amplitude of the input pulses shown in the wave form A in FIG. 2. Rather, each of the pulses in the wave form D occurs at a time totally independent of the amplitude of the pulses in the wave form A. This is because the floating threshold point is derived from the derivative, therefore making the amplitude of the floating threshold point proportional to the amplitude of the pulses indicated in wave form B of FIG. 2. The result is that the threshold point tracks the derivative level, removing any dependence on the amplitude of the input signals.

Figure 3:
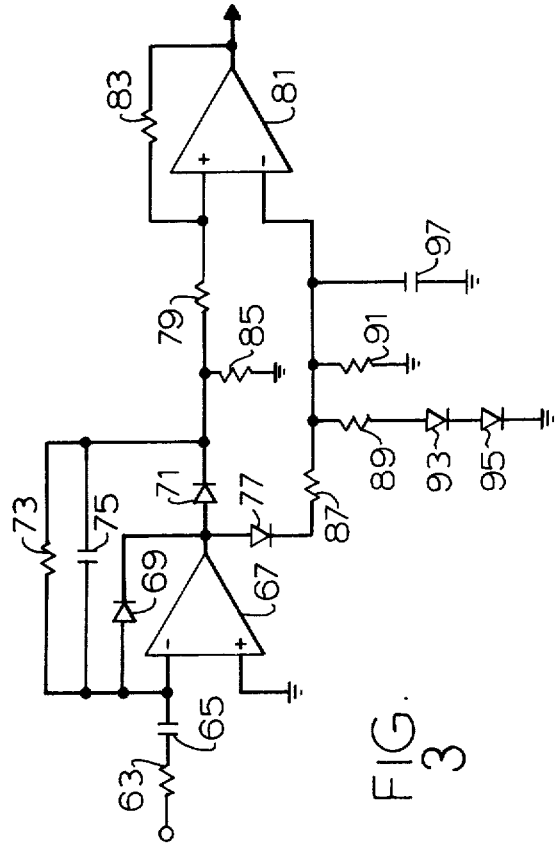
FIG. 3 is a schematic diagram of one form of the apparatus of the invention.

Referring now to FIG. 3, a schematic diagram of a circuit constructed in accordance with the invention and for performing the functions illustrated by the block diagram of FIG. 1 (and which includes the elements 55, 11, 59, 57, 13 and 15) is shown. In particular, a resistor 63 and capacitor 65 are series connected between the output of the preamplifier 35 and the negative input of an amplifier 67. A diode 69 is connected across the negative input and the output of the amplifier 67 and the positive input of the amplifier 67 is grounded. A diode 71 is connected in series with the output of the amplifier 67, and a resistor 73 and capacitor 75 are connected in parallel with each other across the series combination of the amplifier 67 and the diode 71. A diode 77 is also series connected with the output of the amplifier 67. The combination of the resistors 63, and 73, the capacitors 65 and 75, and the diodes 69, 71, and 77, together with the amplifier 67, forms a unique circuit that combines the low pass filter, differentiator, and two half-wave precision rectifier functions of the elements 55, 11, 57, and 59 of FIG. 1, utilizing just a single operational amplifier.

The diode 71 is series connected through a resistor 79 to the positive input of an operational amplifier 81. A resistor 83 is connected to the operational amplifier 81, and a load resistor 85 is connected from the junction between the diode 71 and the resistor 79 to ground. The resistor 85, resistor 79, resistor 83, and operational amplifier 81 together form the comparator 15 of FIG. 1.

The function of the floating threshold network 13 of FIG. 1 is performed, in the circuit of FIG. 3, by resistors 87, 89, and 91, diodes 93, and 95, and capacitor 97. The resistor 87 is series connected between the diode 77 and the negative input of the operational amplifier 81. The resistor 89 is connected in series with the diodes 93 and 95 from the junction between the resistor 87 and the amplifier 81 to ground. The resistor 91 is connected in parallel with the combination of the resistor 89 and diodes 93 and 95. The capacitor 97 is connected in parallel with the resistor 91. The resistor 87 attenuates the output of the amplifier 67, as does the resistor 91. On the rising edge of the output signal of the amplifier 67, the capacitor 97 follows the increasing signal or positive output.

The capacitor 97, together with the resistors 87 and 91 also serves as a network which determines the decay rate of the signal as shown by the decreasing edge of the pulses in wave form C of FIG. 2. As soon as the first signal begins to decrease, diode 77 becomes reverse biased, allowing capacitor 97 to discharge. The discharge (or decay) rate is controlled by resistors 89, 91, diodes 83, 95, and capacitor 97. When the voltage across capacitor 97 is below the combined forward breakdown voltage ($V_{FBR}$) of diodes 93 and 95, resistor 89 is effectively isolated from capacitor 97. Thus resistor 91 and capacitor 97 are the dominant decay rate factors. However, when the voltage across capacitor 97 is above the combined $V_{FBR}$ of diodes 93 and 95, a faster decay rate occurs since resistor 89 is in effect in parallel with resistor 91 and capacitor 97. This makes the decay rate dependent on the amplitude of the derivative signal in wave form B of FIG. 2. Thus, the threshold point floats in accordance with the amplitude of the derivative signal in wave form B, making it independent of the maximum amplitude of the signals and pulses in the wave form A of FIG. 2.

Figure 4:
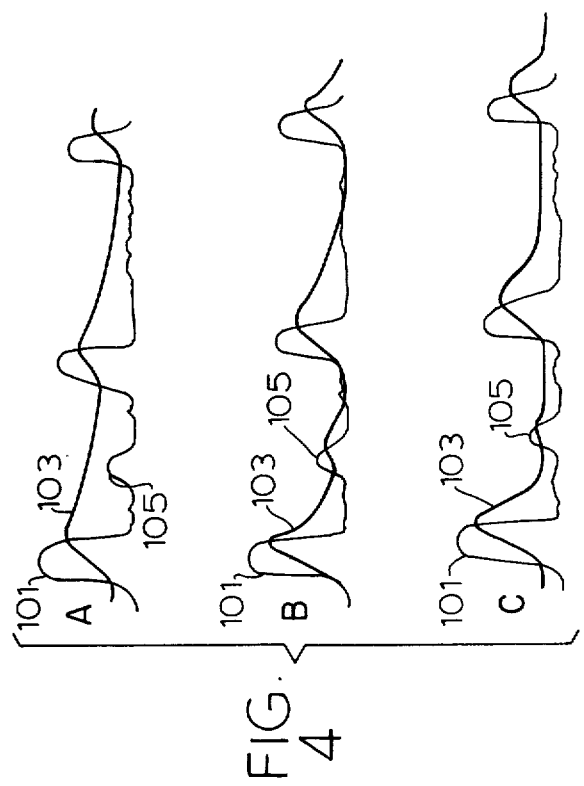
FIG. 4 is a graph illustrating the advantage of the invention as compared with conditions typically encountered in prior art systems.

Referring now particularly to FIG. 4, the advantage of the invention is illustrated by way of example. Wave form A of FIG. 4 depicts a circuit wherein a single time constant, sufficient to minimize the possibility of false triggering due to noise, can miss a pulse. In other words, a circuit designed with a single constant wherein the decay time is independent of amplitude results in a wave form 101 for one input to the comparator and a wave form 103 for the other. It may be seen that the pulse indicated at 105 is missed, because it was of insufficient magnitude. In wave form B of FIG. 4, the time constant of the circuit has been minimized to assure detection of all pulses. However, the decay is so low as to decay into the noise level, which can result in false triggering and spurious synchronizing pulses. In wave form C of FIG. 4, the advantage of amplitude dependent decay at low amplitude is illustrated, inasmuch as the pulse 105 is picked up whereas the signal 103 never decays into the noise level.

It may be seen, therefore, that the invention provides an improved method and apparatus for developing a series of synchronizing pulses related to a series of input pulses, wherein the synchronizing pulses are independent of the amplitude of the input pulses and wherein the effects of noise and variation in input pulse rate are readily accommodated.

Various modifications of the invention in addition to those shown and described herein will become apparent to those skilled in the art from the foregoing description and accompanying drawings. Such modifications are intended to fall within the scope of the appended claims.

What is claimed is:

1. A method of developing a series of synchronizing pulses related to a series of input pulses of variable amplitude, comprising, developing a first signal having an amplitude which is proportional to the derivative of the rising or falling portion of each of of the input pulses, developing a second signal related to said first signal and having a minimum amplitude which is greater than the minimum amplitude of the first signal and having a decay characteristic slower than that of the first signal such that the amplitude of said second signal becomes equal to the amplitude of said first signal at a threshold point which is proportional to the amplitude of said first signal, and developing a series of synchronizing pulses each related to a respective threshold point, whereby the phase of the synchronizing pulses is independent of the amplitude of the input pulses.

2. A method according to claim 1 wherein the second signal is developed from the first signal.

3. A method according to claim 1 wherein the synchronizing pulses are square wave pulses.

4. Apparatus for developing a series of synchronizing pulses related to a series of input pulses of variable amplitude, comprising, means for developing a first signal having an amplitude which is proportional to the derivative of the rising or falling portion of each of the input pulses, means for developing a second signal related to said first signal and having a minimum amplitude which is greater than the minimum amplitude of said first signal and having a decay characteristic slower than that of the first signal such that the amplitude of said second signal becomes equal to the amplitude of said first signal at a threshold point which is proportional to the amplitude of said first signal, and means for developing the series of synchronizing pulses each related to a respective threshold point, whereby the phase of the synchronizing pulses is independent of the amplitude of the input pulses.

5. Apparatus according to claim 4 wherein said means for developing the first signal include a derivative circuit and half-wave rectifier means for eliminating one polarity of the derivative signal.

6. Apparatus according to claim 5 wherein said second signal developing means comprise an R-C network connected in series with said half-wave rectifier means to attenuate and delay the output thereof, and wherein said synchronizing pulse developing means comprise comparator means connected to both said R-C network and said half-wave rectifier means.

7. Apparatus for developing a series of synchronizing pulses related to a series of input pulses of variable amplitude above a background noise level, comprising, differentiator means for developing a first signal having an amplitude which is porportional to the derivative of the rising or falling portion of each of the input pulses, comparator means having a pair of input means, said comparator means being responsive to signals at said input means having a predetermined first relationship to provide an output signal and being responsive to signals at said input means of a predetermined second relationship to provide zero output, means connecting said differentiator means directly to one of said inputs of said comparator means, and a floating threshold network coupled between said differentiator means and the other of said input means of said comparator means, said floating threshold network developing a second signal having an amplitude proportional to said first signal but a minimum amplitude which is greater than the minimum amplitude of said first signal and a decay characteristic slower than that of said first signal such that the amplitude of said second signal becomes equal to the amplitude of said first signal at a threshold point which is proportional to the amplitude of said first signal, whereby the condition of said inputs of said comparator means changes from said first relationship to said second relationship at a point which is independent of the amplitude of said input pulses.

8. Apparatus according to claim 7 including first half-wave rectifier means coupling said differentiator means directly to said comparator means, and second half-wave rectifier means connecting said differentiator means to said floating threshold network, said floating threshold network comprising an R-C network for attenuating and delaying the output of said second half-wave rectifier means.

* * * * *